United States Patent
Yu et al.

(10) Patent No.: US 10,558,777 B1
(45) Date of Patent: Feb. 11, 2020

(54) METHOD OF ENABLING A PARTIAL RECONFIGURATION IN AN INTEGRATED CIRCUIT DEVICE

(71) Applicant: Xilinx, Inc., San Jose, CA (US)

(72) Inventors: Hao Yu, Bellevue, WA (US); Raymond Kong, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 117 days.

(21) Appl. No.: 15/820,926

(22) Filed: Nov. 22, 2017

(51) Int. Cl.
*G06F 17/50* (2006.01)

(52) U.S. Cl.
CPC ...... *G06F 17/5054* (2013.01); *G06F 17/5072* (2013.01); *G06F 17/5077* (2013.01)

(58) Field of Classification Search
CPC ............. G06F 17/5054; G06F 17/5072; G06F 17/5077
See application file for complete search history.

(56) References Cited

U.S. PATENT DOCUMENTS

| | | | |
|---|---|---|---|
| 6,091,263 A | 7/2000 | New et al. | |
| 6,150,839 A | 11/2000 | New et al. | |
| 6,204,687 B1 | 3/2001 | Schultz et al. | |
| 6,462,579 B1 | 10/2002 | Camilleri et al. | |
| 6,526,557 B1 | 2/2003 | Young et al. | |
| 6,759,869 B1 | 7/2004 | Young et al. | |
| 6,810,514 B1 | 10/2004 | alfke et al. | |
| 6,836,842 B1 | 12/2004 | Guccione et al. | |
| 6,907,595 B2 | 6/2005 | Curd et al. | |
| 7,024,651 B1 | 4/2006 | Camilleri et al. | |
| 7,057,413 B1 | 6/2006 | Young et al. | |
| 7,124,338 B1 | 10/2006 | Mark et al. | |
| 7,224,184 B1 | 5/2007 | Levi et al. | |
| 7,451,420 B1 * | 11/2008 | Reynolds | G06F 17/5054 716/128 |
| 7,477,072 B1 | 1/2009 | Kao et al. | |
| 7,478,357 B1 * | 1/2009 | Mason | G06F 17/5054 716/138 |
| 7,482,836 B2 | 1/2009 | Levi et al. | |
| 7,509,617 B1 | 3/2009 | Young | |
| 7,518,396 B1 | 4/2009 | Kondapalli et al. | |
| 7,523,023 B1 * | 4/2009 | Koh | G06F 8/35 703/2 |

(Continued)

OTHER PUBLICATIONS

U.S. Appl. No. 15/285,786, filed Oct. 5, 2016, Liu, Jun et al., Xilinx, Inc. San Jose, CA USA.

(Continued)

*Primary Examiner* — Nha T Nguyen
(74) *Attorney, Agent, or Firm* — John J. King

(57) ABSTRACT

A method of implementing a partial reconfiguration in an integrated circuit device is described. The method comprises reading a netlist for a design of a circuit comprising a reconfigurable module; defining a first region of the integrated circuit device having the reconfigurable module; defining a second region that encompasses the first region; placing the reconfigurable module of the design in the first region, wherein the reconfigurable module comprises a partition pin of a plurality of available partition pins; selectively removing the partition pin; routing drivers and loads that are in the second region; and generating a partial bitstream for the reconfigurable module.

20 Claims, 9 Drawing Sheets

(56) References Cited

U.S. PATENT DOCUMENTS

| | | | | |
|---|---|---|---|---|
| 7,600,210 | B1* | 10/2009 | Mason | G06F 17/5068 716/138 |
| 7,619,442 | B1 | 11/2009 | Mason et al. | |
| 7,640,527 | B1 | 12/2009 | Dorairaj et al. | |
| 7,724,815 | B1 | 5/2010 | Raha et al. | |
| 7,746,099 | B1 | 6/2010 | Chan et al. | |
| 7,941,777 | B1* | 5/2011 | Young | G06F 17/5054 716/104 |
| 8,102,188 | B1 | 1/2012 | Chan et al. | |
| 8,176,212 | B1* | 5/2012 | Smith | G06F 15/7867 710/8 |
| 8,250,513 | B1* | 8/2012 | Verma | G06F 17/5077 716/110 |
| 8,352,898 | B1* | 1/2013 | Kellermann | G06F 17/5054 716/116 |
| 8,359,448 | B1 | 1/2013 | Neuendorffer | |
| 8,415,974 | B1 | 4/2013 | Lysaght | |
| 8,686,753 | B1* | 4/2014 | Herrmann | H03K 19/17756 326/16 |
| 8,719,750 | B1* | 5/2014 | Balzli, Jr. | G06F 17/5072 716/113 |
| 8,910,109 | B1* | 12/2014 | Orthner | H03K 19/003 110/116 |
| 8,928,351 | B1 | 1/2015 | Konduru | |
| 8,977,995 | B1* | 3/2015 | Arora | G06F 17/505 716/105 |
| 8,984,464 | B1* | 3/2015 | Mihal | G06F 17/5072 716/118 |
| 9,141,747 | B1* | 9/2015 | Orthner | H03K 19/003 |
| 9,183,339 | B1* | 11/2015 | Shirazi | G06F 17/5054 |
| 9,191,617 | B1* | 11/2015 | James | H04N 7/152 |
| 9,361,421 | B2* | 6/2016 | Goldman | G06F 17/5054 |
| 9,584,130 | B1* | 2/2017 | Weber | H03K 19/17756 |
| 9,847,911 | B1* | 12/2017 | Gigandet | H04L 41/0816 |
| 10,296,699 | B1* | 5/2019 | Yu | G06F 17/5077 |
| 10,303,648 | B1* | 5/2019 | Das | G06F 15/7867 |
| 2006/0294485 | A1* | 12/2006 | Kaul | G06F 17/5077 716/113 |
| 2007/0283311 | A1* | 12/2007 | Karoubalis | G06F 17/5054 326/38 |
| 2010/0283505 | A1* | 11/2010 | Koch | G06F 15/7867 326/41 |
| 2012/0227026 | A1* | 9/2012 | Goldman | G06F 17/5054 716/128 |
| 2018/0081840 | A1* | 3/2018 | Custodio | G06F 9/4405 |
| 2019/0042533 | A1* | 2/2019 | Custodio | G06F 15/7867 |

OTHER PUBLICATIONS

U.S. Appl. No. 15/468,021, filed Mar. 23, 2017, Yu, Hao et al., Xilinx, Inc. San Jose, CA USA.

* cited by examiner

US 10,558,777 B1

METHOD OF ENABLING A PARTIAL RECONFIGURATION IN AN INTEGRATED CIRCUIT DEVICE

FIELD OF THE INVENTION

The present invention relates generally to integrated circuit devices, and in particular, to a method of enabling a partial reconfiguration in an integrated circuit device.

BACKGROUND OF THE INVENTION

In the implementation of conventional routing techniques, a partition pin selection is required for every boundary signal net routing. After an initial implementation, all partition pin nodes are selected either at the beginning of routing or at the end of routing, where the same boundary connection is used after carving out a reconfigurable module (RM) logic. All the static routing nodes at the boundary or outside of the RM logic are preserved, while all the RM routing nodes are eliminated. On the same boundary path, the new RM driver may be placed in a different location, while the static placement (e.g. a static load) and static routing may not change. Therefore, the router needs to route from the new RM driver to an existing partition pin node.

A significant disadvantage of such conventional routing techniques is that, during re-implementation process, the router has to route the new RM driver/load to/from the partition pin node. This routing constraint may cause congestion due to limited routability to and from the partition pin node, as well as a quality of result (QoR) degradation, in the re-implementation process of the partial reconfiguration flow. Another disadvantage of such conventional routing techniques is that, for the boundary nets which are not proper for post-route partition pin assignment, the pre-assigned partition pin selected during placement may be sub-optimal, leading to routability issues and QoR degradation in initial implementation of Partial Reconfiguration flow.

Accordingly, there is a need for implementing a partial reconfiguration that selectively implements partition pins.

SUMMARY OF THE INVENTION

A method of implementing a partial reconfiguration in an integrated circuit device is described. The method comprises reading a netlist for a design of a circuit comprising a reconfigurable module; defining a first region of the integrated circuit device having the reconfigurable module; defining a second region that encompasses the first region; placing the reconfigurable module of the design in the first region, wherein the reconfigurable module comprises a partition pin of a plurality of available partition pins; selectively removing the partition pin; routing drivers and loads that are in the second region; and generating a partial bitstream for the reconfigurable module.

A system is also described, wherein the system comprises a processor, and a computer-readable medium storing instructions which, when executed by the processor, cause the processor to perform operations, the operations comprising: reading a netlist for a design of a circuit comprising a reconfigurable module; defining a first region of the integrated circuit device having the reconfigurable module; defining a second region that encompasses the first region; placing the reconfigurable module of the design in the first region, wherein the reconfigurable module comprises a partition pin of a plurality of available partition pins; selectively removing the partition pin; routing drivers and loads that are in the second region; and generating a partial bitstream for the reconfigurable module.

A non-transitory computer-readable medium storing instructions which, when executed by a processor, cause the processor to perform operations is also described, wherein the operations comprise reading a netlist for a design of a circuit comprising a reconfigurable module; defining a first region of the integrated circuit device having the reconfigurable module; defining a second region that encompasses the first region; placing the reconfigurable module of the design in the first region, wherein the reconfigurable module comprises a partition pin of a plurality of available partition pins; selectively removing the partition pin; routing drivers and loads that are in the second region; and generating a partial bitstream for the reconfigurable module.

DETAILED DESCRIPTION OF THE DRAWINGS

In a programmable logic device (PLD), such as a field programmable gate array (FPGA) partial reconfiguration, one or more logical design instances implemented on a FPGA chip can be reconfigured or replaced with a new or different function without interrupting the rest of the design. The design instances that could be reconfigured may be called reconfigurable modules (RMs), where the design part that is not to be changed is referred to as static logic (or Static). Unlike conventional techniques that preserve the logical and physical interface connection for each RM in a partial reconfiguration design, the circuits and methods for implementing a partial reconfiguration routing node crossing, defined as a partition pin (which is a routing node that separates the Static routing and RM routing), does not require that the partition pin be in the same location after the partial reconfiguration.

More particularly, in a Partial Reconfiguration (PR) flow for a FPGA, circuits and methods are described for the routing of boundary nets of a Reconfigurable Module (RM). The circuits and methods provide new ways of implementing boundary net routing, carving and re-routing in a partial reconfiguration flow. According to one implementation, partition pin assignment on boundary nets are removed under certain conditions. The removal of partition pin assignment on boundary nets simplifies the constraints on boundary nets. Further, the removal of partial pin assignments on boundary nets maximizes routability in the re-routing process of the partial reconfiguration flow. Therefore, the circuits and methods improve routability and QoR in both initial implementation and re-implementation processes for FPGA Partial Reconfiguration applications. According to one implementation, no physical routing partition is needed for the boundary nets with both driver and loads in the routing footprint, leading to improvements in quality of results, such as routability and circuit frequency.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
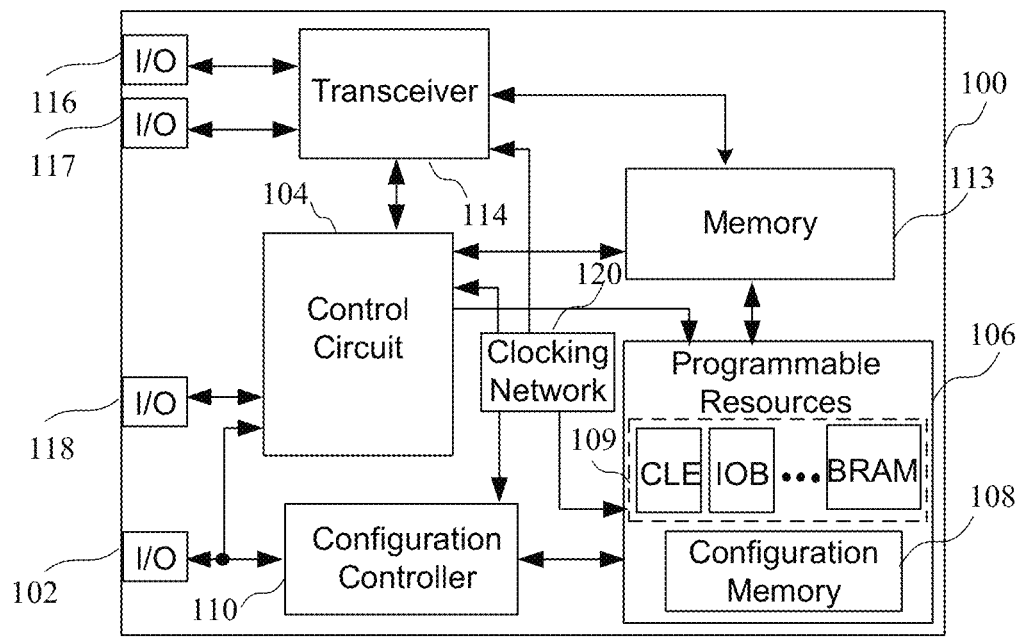
FIG. 1 is an example of a block diagram of an integrated circuit having reconfigurable circuits.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods as described in more detail below could be implemented to a method of enabling a partial reconfiguration in an integrated circuit device using the circuit of FIG. 1, for example.

Figure 2:
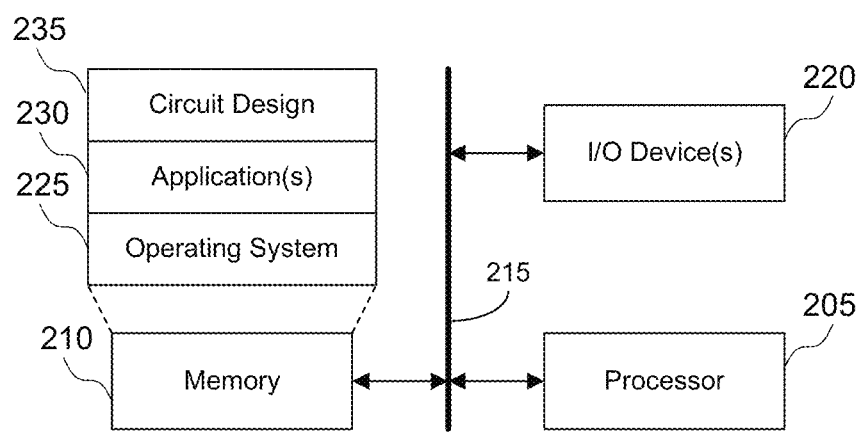
FIG. 2 illustrates an example of a data processing system for use with one or more embodiments described herein.

FIG. 2 illustrates an example of a data processing system 200 for use with one or more embodiments described herein. System 200 includes at least one processor 205, e.g., a central processing unit (CPU). Processor 205 is coupled to memory 210 through interface circuitry 215. System 200 stores computer readable instructions (also referred to as "program code") within memory 210. Memory 210 may be considered an example of computer readable storage media. Processor 205 executes the program code accessed from memory 210 via interface circuitry 215. In an aspect, system 200 is implemented as a computer or other system or device that is suitable for storing and/or executing program code.

Memory 210 includes one or more physical memory devices such as, for example, a local memory and one or more bulk storage devices. The term "local memory" refers to random access memory (RAM) or other non-persistent memory device(s) generally used during actual execution of the program code. The term "bulk storage device" refers to persistent data storage devices such as a hard disk drive (HDD), solid state drive (SSD), etc. System 200 may also include one or more cache memories (not shown) that provide temporary storage of at least some program code in order to reduce the number of times program code must be retrieved from a bulk storage device during execution.

Examples of interface circuitry 215 include, but are not limited to, an input/output (I/O) subsystem, an I/O interface, a bus system, a memory interface, etc. For example, interface circuitry 215 may be one or more of any of several types of bus structures, including a memory bus or memory controller, a peripheral bus, an accelerated graphics port, and a processor or local bus using any of a variety of bus architectures.

System 200 further may include one or more input/output (I/O) devices 220 coupled to interface circuitry 215. I/O devices 220 may be coupled to system 200, e.g., interface circuitry 215, either directly or through intervening I/O controllers. Examples of I/O devices 220 include, but are not limited to, a keyboard, a display device, a pointing device, one or more communication ports, a network adapter, etc. A network adapter refers to circuitry that enables system 200 to become coupled to other systems, computer systems, remote printers, and/or remote storage devices through intervening private or public networks. Modems, cable modems, Ethernet cards, and wireless transceivers are examples of different types of network adapters that may be used with system 100.

Memory 210 stores one or more program modules. The program modules may generally include routines, programs, objects, components, logic, data structures, and so on. For purposes of illustration, memory 210 stores an operating system 225, one or more application(s) 230, and a circuit design 235. In one or more embodiments, application(s) 230 include an EDA application. The EDA application is capable of performing a design flow on circuit design 235 as described herein in greater detail.

In an aspect, operating system 225 and application(s) 230, being implemented in the form of executable program code, are executed by system 200 and, more particularly, by processor 205, to perform the operations described within this disclosure. As such, operating system 225 and application(s) 230 may be considered an integrated part of system 200. Further, it should be appreciated that any data used, generated, and/or operated upon by system 200 (e.g., processor 205) are functional data structures that impart functionality when employed as part of the system.

System 200 may include fewer components than shown or additional components not illustrated in FIG. 2 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

System 200, in executing application 230, is adapted to operate on circuit design 235. In one or more embodiments, system 200 performs synthesis, placement, and routing on circuit design 235. Subsequent to routing, system 200 identifies nets that cross boundaries of reconfigurable partitions. System 200 is capable of selecting particular tiles and wires within the selected tiles used to route the nets to serve as partition pins.

Figure 3:
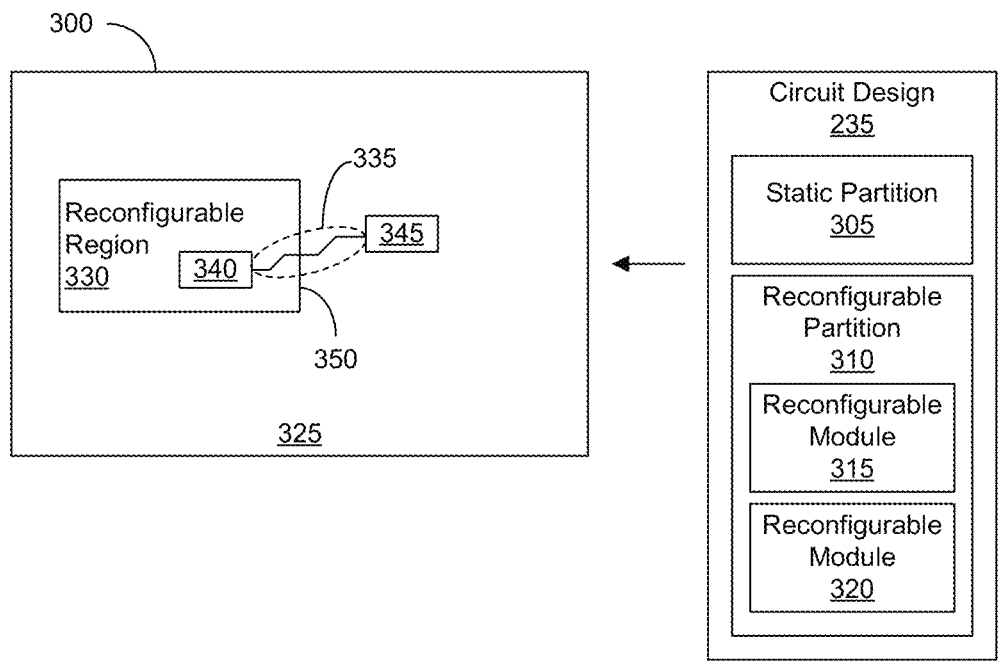
FIG. 3 illustrates an example of a circuit design with a reconfigurable partition and implementation of the circuit design within an integrated circuit.

FIG. 3 illustrates an example of a circuit design with a reconfigurable partition and implementation of the circuit design within an integrated circuit. FIG. 3 illustrates an example of circuit design 235 being implemented within an IC 300.

In an embodiment, circuit design 235 is specified in a hardware description language (HDL) and stored in a data storage device, e.g., memory. System 200 is capable of processing circuit design 235 through a design flow to generate one or more configuration bitstreams (which may include one or more partial bitstreams). The configuration bitstreams may be loaded into IC 300 thereby physically implementing circuit design 235 therein.

In general, circuit design 235 includes two partitions. It should be appreciated that circuit design 235 may include more than two partitions and that the number of partitions used within this disclosure is for purposes of illustration only. The first partition is a static partition 305. In general, static partition 305 refers to the part of circuit design 235 that does not change during partial reconfiguration. Static partition 305, for example, can include the top level and all modules of circuit design 235 not defined as "reconfigurable" or having such an attribute associated therewith. Static partition 305 specifies static circuitry stat (e.g., static logic and static routing) implemented within IC 300.

The second partition is a reconfigurable partition 310. Reconfigurable partition 310 includes a plurality of reconfigurable modules. In an example, a reconfigurable module refers to the netlist or HDL description that is implemented within a reconfigurable partition. Multiple reconfigurable modules may exist for a given reconfigurable partition. In the example of FIG. 3, reconfigurable partition 310 includes reconfigurable module 315 and reconfigurable module 320. Each of reconfigurable modules 315 and 320 specifies a circuit that is implemented in a reconfigurable region 330 of IC 300, albeit one at a time in alternating fashion.

For example, circuit design 235, as initially implemented in IC 300, may include circuitry of reconfigurable module 315 implemented in reconfigurable region 330. In response to an instruction, an event (e.g., an external event), or some other condition, reconfigurable region 330 is "dynamically" reconfigured to implement the circuitry of reconfigurable module 320. The reconfiguration of reconfigurable region 330 occurs while static circuitry 325 continues to operate uninterrupted. In this manner, the circuitry within reconfigurable region 330 may be changed to implement circuitry of reconfigurable module 315 or circuitry of reconfigurable module 320 as needed during operation of IC 300 without interrupting operation of, or changing, static circuitry 325. Typically, this is accomplished by loading a partial bitstream that reconfigures reconfigurable region 330 to implement circuitry of one module or another while leaving static circuitry 325 unchanged.

For purposes of illustration, reconfigurable module 315 is considered to be, at least initially, implemented in reconfigurable region 330. As shown, reconfigurable module 315 includes a net 335 that has endpoints 340 and 345. Endpoint 340 is part of reconfigurable module 315 and, as such, is located in reconfigurable region 330. Endpoint 345 is located in, and implemented by, static circuitry 325. For purposes of discussion, endpoint 340 may be considered a driver and endpoint 345 considered a load. As illustrated, net 335 crosses a boundary 350 of reconfigurable region 330 (and thus reconfigurable partition 310).

In one or more embodiments, IC 300 is a programmable IC. An example of a programmable IC is a field programmable gate array (FPGA) that includes an array of tiles, where each tile is formed of programmable circuitry. Examples of tiles include, but are not limited to, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Each tile typically includes programmable interconnect circuitry and programmable logic circuitry. The programmable interconnect circuitry typically includes a large number of interconnect lines (e.g., wires) of varying lengths.

Referring again to FIG. 3, net 335 traverses through a plurality of tiles (not shown). For purposes of illustration, each horizontal segment of net 335 may be referred to as a wire and is located within a tile. The term "node," as used herein, refers to a data structure representing a wire of a tile of an IC. Within this disclosure, the term node may be used interchangeably with the term wire from time-to-time. In some cases, reference to a particular node or wire further references the particular tile in which that node or wire is located. Thus, net 335 may be represented as a set of nodes (wires) used to route net 335.

System 200 is capable of selecting a node of net 335 as the partition pin. In the example of FIG. 3, the partition pin refers to the wire used as a logical and physical interface between reconfigurable partition 330 (e.g., and any reconfigurable modules implemented therein) and static circuitry 325 for dynamic partial reconfiguration within IC 300. For purposes of description, the partition pin may also be referred to as a "Steiner node" since the partition pin represents a connection point between two different portions of a net. Referring to FIG. 3, for example, the partition pin represents a connection point between a first portion of net 335 that is within reconfigurable module 330 and a second portion of net 335 that is within static circuitry 325 (e.g., external to reconfigurable module 330). For purposes of discussion, the partition pin effectively separates net 335 into two sub-nets.

Selection of a suitable node or nodes as the partition pins can have a significant impact upon routing and, as such, timing of the circuit design as implemented within the IC. While the endpoint 345 remains unchanged (including the location), the location of the other end of net 335 (and the partition pin) when reconfigurable module 320 is implemented within reconfigurable region 330 may change as will be described in more detail below.

Figure 4:
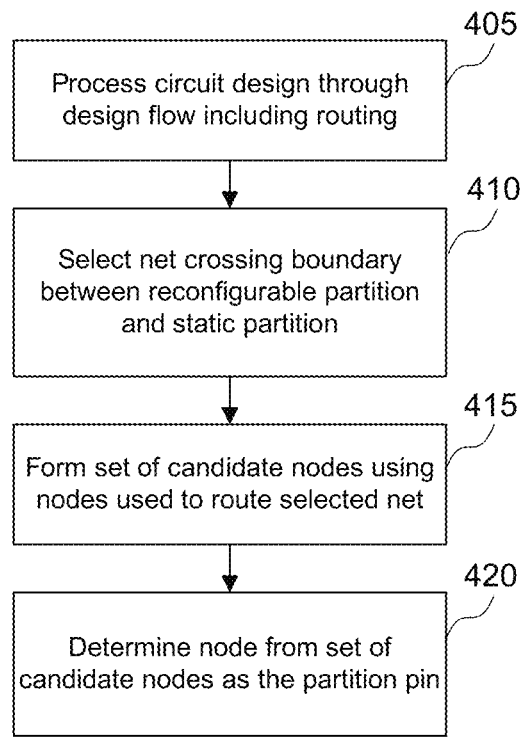
FIG. 4 illustrates an example method of implementing a circuit design having a reconfigurable partition.

FIG. 4 illustrates an example method 400 of implementing a circuit design having a reconfigurable partition. Method 400 may be performed by a system the same as or similar to the system described in connection with FIG. 2.

Method 400 can begin in block 405 where the system processes the circuit design through a design flow including routing. Implementing a circuit design within an IC, whether a programmable IC or an application specific IC (ASIC), entails processing the circuit design through the design flow. The design flow includes multiple, different phases. These phases generally include synthesis, placement, and routing.

Synthesis refers to the process of converting, or translating, an abstract, programmatic description of a circuit into a low-level design implementation. The abstract, programmatic description of the circuit describes behavior of the circuit and is also referred to as a "behavioral description" or a "register transfer level (RTL) description" of the circuit. The behavioral description is often specified using an HDL. The low-level design implementation generated through synthesis typically is specified as inter-connected logic gates.

Synthesis may also include mapping. Mapping is the process of correlating, or matching, the logic gates of the low-level circuit design to the various types of physical circuit blocks that are actually available in the particular IC in which the circuit design is to be implemented, i.e., the "target IC." For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned. Routing is the process of selecting particular routing resources such as wires, programmable interconnection points (PIPs), PIP settings, and/or other interconnect circuitry to electrically couple the various circuit blocks of the target IC after placement.

In block 410, the system selects a routed net crossing a boundary between the reconfigurable partition of the circuit design and the static partition of the circuit design. An example of a routed net crossing a boundary as described is a routed net of the circuit design having a driver located in the reconfigurable partition (static partition) and a load located in the static partition (reconfigurable partition). Accordingly, the system is capable of identifying such a net of the routed circuit design and selecting the net for further processing.

For purposes of illustration, the processing of a single net is described. It should be appreciated, however, that a circuit design with a reconfigurable partition may include more than a single net crossing the boundary between reconfigurable partition and the static circuitry. As such, the operations described within this disclosure relating to selection of a partition pin would be performed for each such net in order to create an interface for the reconfigurable partition to implement the circuit design within an IC.

In block 415, the system forms a set of candidate nodes. The set of candidate nodes, for purposes of selecting a partition pin for the net, is, at least initially, each node used to route the selected net. In block 420, the system determines a node from the set of candidate nodes to be the partition pin. In one or more embodiments, the system applies different criteria to the set of candidate nodes to determine a node (from the set of candidate nodes) as the partition pin for partial reconfiguration. However, as will be described in more detail below, a partition pin may not be retained during a partial reconfiguration The system is capable of removing, e.g., excluding, one or more nodes from the set of candidate nodes that do not meet certain criteria. Once removed from the set of candidate nodes, the removed, or excluded, nodes are no longer considered for use as the partition pin. Having reduced the set of candidate nodes by removing one or more nodes, the system is further capable of selecting a node from the remaining nodes of the set of candidate nodes.

Referring to FIG. 3, for example, the system ensures that any portion of a net of a reconfigurable module that is supposed to connect to endpoint 345 flows through, e.g., is routed through, a partition pin. For each other reconfigurable module to be implemented within the reconfigurable region, the system routes the reconfigurable module so that the source (driver) of such a net that couples to endpoint 345 connects to a partition pin.

Figure 5:
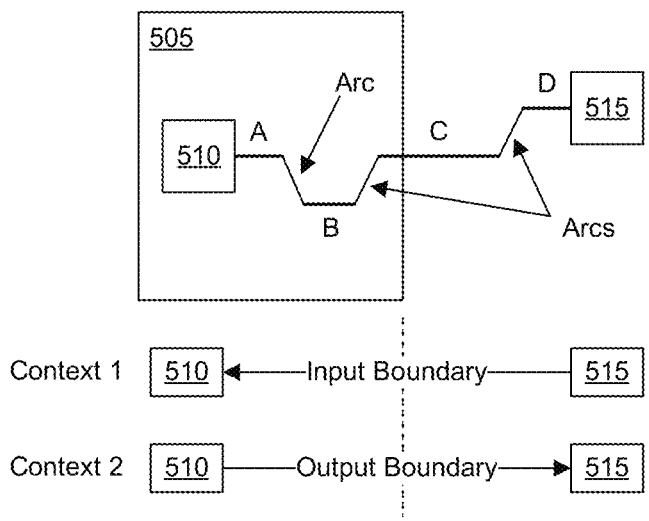
FIG. 5 illustrates example criteria used to remove nodes from the set of candidate nodes for purposes of selecting a node as a partition pin.
Figure 6:
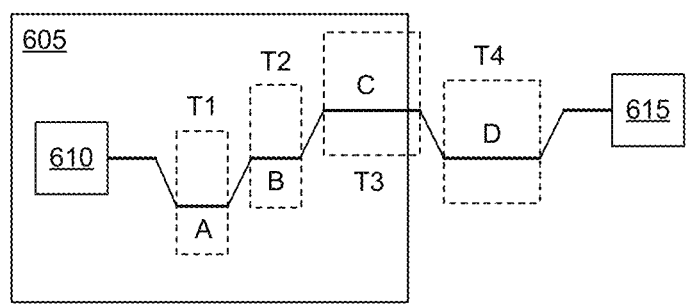
FIG. 6 illustrates example criteria used to select a node as a partition pin.

FIGS. 5 and 6 illustrate different criteria applied by the system for purposes of selecting a partition pin. For example, FIGS. 5 and 6 each illustrate criteria applied in block 420 of FIG. 4.

FIG. 5 illustrates example criteria used to filter or remove nodes from the set of candidate nodes for purposes of selecting a node as a partition pin. The examples illustrated in connection with FIG. 5 may be referred to herein as "exclusionary criteria" since the system applies the criteria to remove nodes from the set of candidate nodes.

As pictured, FIG. 5 illustrates a reconfigurable region 505. Reconfigurable region 505 includes a net that is formed of a plurality of different nodes (wires) labeled A, B, C, and D. Each of nodes A, B, C, and D may be referred to as a routing node since the nodes are used to route the net pictured in FIG. 5. The net crosses the boundary between reconfigurable region 505 having a reconfigurable module implemented therein (e.g., corresponding to the reconfigurable partition of the circuit design) and the static circuitry (e.g., corresponding to the static partition of the circuit design) external thereto. The net has an endpoint 510 located within reconfigurable region 505 and an endpoint 515 located in static circuitry external to reconfigurable region 505.

In one or more of the examples described below, the particular exclusionary criterion applied is contextually dependent upon the logical net connection, e.g., the direction of the net as depicted in contexts 1 and 2. For example, a criterion may be applied in one manner for context 1 where endpoint 515 is the driver in static circuitry and endpoint 510 is the load within the reconfigurable module, and in a different manner for context 2 where endpoint 510 is the driver in the reconfigurable module and endpoint 515 is the load in static circuitry. In the case of context 1, the net is an input boundary net, e.g., a net of an input port. In the case of context 2, the net is an output boundary net, e.g., a net of an output port.

A first example exclusionary criterion for use in removing nodes from the set of candidate nodes is that a node selected as a partition pin cannot be a site-pin node. Site-pin nodes are nodes that are directly coupled to an endpoint of the net for which a partition pin is being determined. The system may apply the first example exclusionary criterion differently based upon the context. In the case of context 1, the partition pin may not be a load site-pin when the load is placed. For example, node A is a site-pin for the load (endpoint 510) in context 1. Accordingly, in the case of context 1, the system removes or excludes node A from the set of candidate nodes since using the load site-pin as the partition pin would limit the routing options within reconfigurable region 505. In the case of context 2, the partition pin may not be a driver site-pin when the driver is placed. For example, node A, in context 2, is site-pin of the driver (endpoint 510). Accordingly, in the case of context 2, the system removes or excludes node A from the set of candidate nodes since using the driver site-pin as the partition pin would limit the routing options within reconfigurable region 505. Thus, the system is capable of removing those nodes from the set of candidate nodes that are site-pin nodes for the two different contexts described.

A second example exclusionary criterion for use in removing nodes from the set of candidate nodes is that a node selected as a partition pin must have an arc on each end. For example, a node selected as a partition pin must have an arc on the input port and an arc on the output port (e.g., each end of the node). In FIG. 5, arcs are represented as the diagonal lines that link nodes A, B, C, and D. In an aspect, arcs may represent routing and/or interconnect resources of the IC that connect wires of different tiles. For example, arcs may represent PIPs in an IC having an array of tiles formed of programmable circuitry. Thus, node A and node D are excluded from the set of candidate nodes since node A is lacking an input port arc (output port arc) and node D is lacking an output port arc (input port arc) when viewed as an output net (input net).

A third example exclusionary criterion for use in removing nodes from the set of candidate nodes is that a node selected as a partition pin cannot have all input nodes or all output nodes be site-pin nodes. The third example exclusionary criterion is another case that is context dependent. The system removes or excludes each node that does not comply with the third example exclusionary criterion. The system applies the third example exclusionary criterion differently based upon whether the net is an input net or an output net.

In the case of context 1, when the net is an input net, the output nodes of a partition pin may not all be site-pins. For purposes of illustration, when considering output nodes of a given pin in the case of context 1, the output nodes are those nodes that couple to the left end of the node being considered as the partition pin. Thus, in the case of context 1, the node selected as the partition pin may not be connected to only site-pin nodes within reconfigurable region 505. The system, for example, removes or excludes node B from the set of candidate nodes since node B is only connected to site-pin node A on the output side.

In the case of context 2, when the net is an output net, the input nodes of a partition pin may not all be site-pins. For purposes of illustration, when considering output nodes of a given pin in the case of context 2, the input nodes are those nodes that couple to the left end of the node being considered as the partition pin. Thus, in the case of context 2, the node selected as the partition pin may not be connected to only site-pin nodes within reconfigurable region 505. The system, for example, removes or excludes node B from the set of candidate nodes since node B is only connected to site-pin node A on the input side.

A fourth example exclusionary criterion for use in removing nodes from the set of candidate nodes is that each of the nodes for the net between a node selected as the partition pin and the source (or load) within the reconfigurable module must be contained within a routing containment area for the reconfigurable module. Referring to FIG. 5, the routing containment area for reconfigurable region 505 is represented by the edges of the rectangle labeled 505. Selecting either node B or node C results in each node between the selected node and endpoint 510 being located within the containment area for reconfigurable region 505.

A fifth example exclusionary criterion for use in removing nodes from the set of candidate nodes is that a node selected as a partition pin must be of a particular type of routing resource or wire. For example, the system may check a type attribute for each node within the set of candidate nodes and remove each node of a particular type that is unsuited to be a partition pin. As an illustrative and non-limiting example, the system is capable of identifying any nodes of the type "GNODE" and removing such nodes from the set of candidate notes.

Having filtered the set of candidate nodes using one or more or all of the aforementioned criteria, the system is capable of selecting a node from the remaining nodes in the set of candidate nodes as the partition pin.

FIG. 6 illustrates example criteria used to select a node as a partition pin. For example, FIG. 6 illustrates one or more of the criteria used to select a node as the partition pin from the remaining nodes of the set of candidate nodes after applying the example exclusionary criteria described with reference to FIG. 5. The examples illustrated in connection with FIG. 6 may be referred to herein as "selection criteria" since the system applies the criteria to select a node as the partition pin from the set of remaining nodes of the set of candidate nodes.

FIG. 6 illustrates a reconfigurable region 605 having a reconfigurable module implemented therein. For example, reconfigurable module 315 may be implemented therein. A net has an endpoint 610 located within reconfigurable region 605 and an endpoint 615 located in static circuitry external to reconfigurable region 605. In the example of FIG. 6, the net is routed using nodes A, B, C, and D. Thus, each of nodes A, B, C, and D is a routing node and is within the set of candidate nodes after applying the example exclusionary criteria described herein. Node A is part of, or located in, tile T1. Node B is part of, or located in, tile T2. Node C is part of, or located in, tile T3. Node D is part of, or located in, tile T4.

A first example selection criterion applied by the system to select a node is selecting the node that is closest to the endpoint (e.g., driver or load) in the static circuitry. For example, the system is capable of selecting the node closest to the site-pin node of endpoint 615. Thus, in the example of FIG. 6, the system selects node D of Tile T4 as the partition pin. Selecting the node closest to the site-pin node of endpoint 615 provides the router with a greater likelihood of meeting timing for routing further implementations of different reconfigurable modules to be implemented within reconfigurable region. For example, selection of node D provides the router with greater flexibility when routing reconfigurable module 320 for implementation within reconfigurable region 605.

A second example selection criterion applied by the system to select a node is selecting the node within the tile having the least number of Steiner nodes (e.g., partition pins) assigned thereto. By selecting the tile with the fewest partition pins, the likelihood of the router encountering congestion when routing further reconfigurable modules for implementation within reconfigurable region 505 is reduced. It should be appreciated that since the net is routed, selecting a particular tile selects the node within that tile as the partition pin.

As an illustrative example, consider a case where the system, in selecting a partition pin for the net illustrated in FIG. 6 has applied the exclusionary criteria described above and is left with nodes A, B, C, and D with the set of candidate nodes. If, for example, each of tiles T1, T2, T3, and T4 has a same number of partition pins, the system selects node D as the partition pin since node D is the closest node to the site-pin of endpoint 615. If, for example, tile T1 has 3 partition pins, tile T2 has 5 partition pins, tile T3 has 1 partition pin, and tile T4 has 2 partition pins, the system selects node C as the partition pin since tile 3 includes the least number of partition pins.

In an embodiment, the system is capable of applying the first or the second selection criterion based the type of the routing node that is used. For purposes of illustration and not limitation, for routing node types of NODE_SINGLE, NODE_DOUBLE, NODE_HLONG, and NODE_QUARD, the system uses the first selection criterion. For routing node types of NODE_LOCAL, the system uses the second selection criterion. Thus, the system is capable of using both selection criteria for selecting partition pins of a given reconfigurable partition based upon the particular type of routing node that is used. It should be appreciated that the particular types of routing nodes mentioned within this disclosure are for purposes of illustration only. The particular name of a routing node may vary from one IC architecture and/or manufacturer to another. In any case, the system is capable of applying one selection criterion or another based upon the type of routing nodes being considered.

Figure 7:
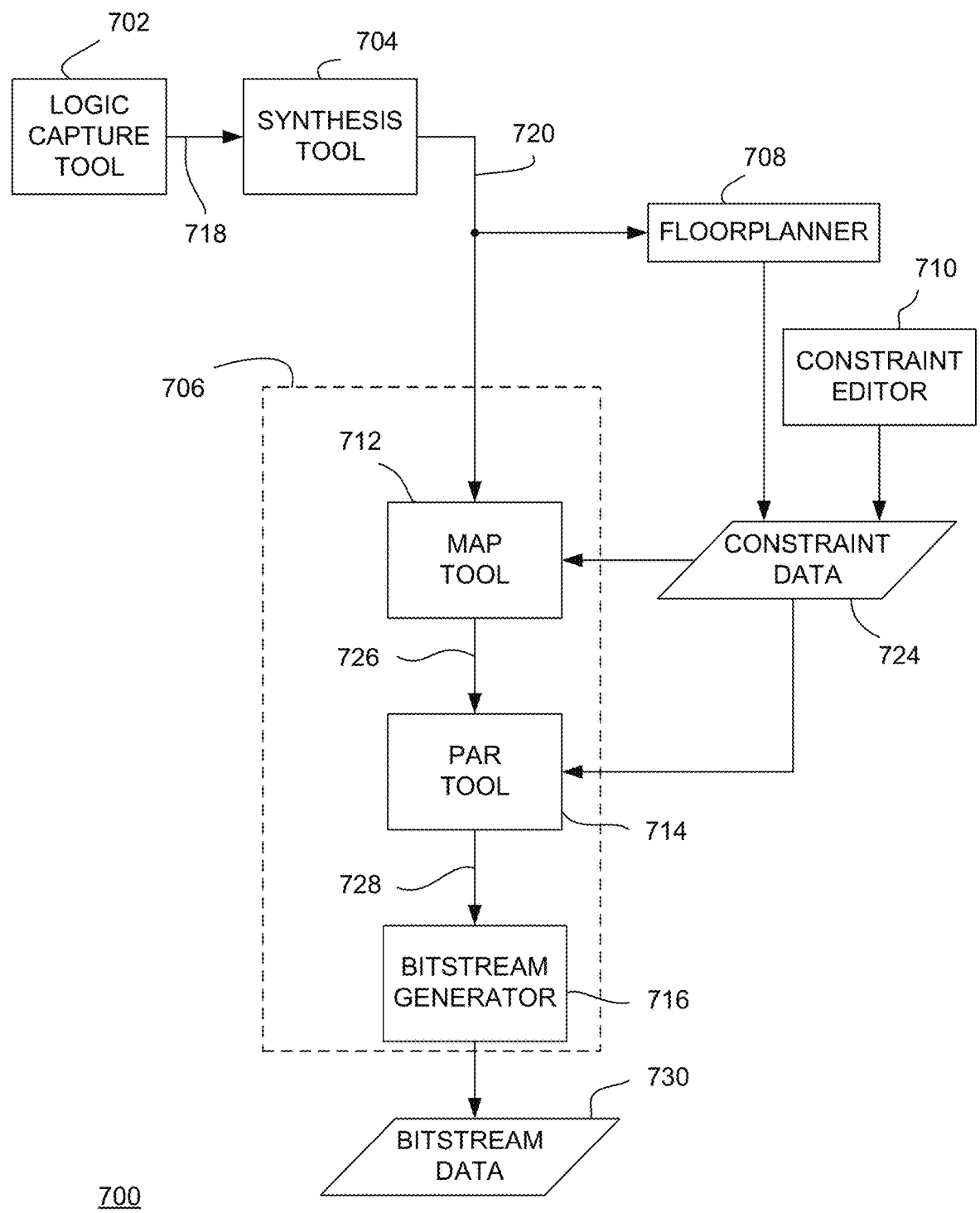
FIG. 7 is a block diagram depicting an illustrative example of a logic design system for a programmable logic device (PLD) in accordance with one or more aspects of the present disclosure.

FIG. 7 is a block diagram depicting an illustrative example of a logic design system 700 for a programmable logic device (PLD) in accordance with one or more aspects of the present disclosure. The system 700 includes a logic capture tool 702, a synthesis tool 704, a floorplanner 708, a constraint editor 710, and an implementation tool 706. In the present example, the system 700 is configured to implement a logic design using a target FPGA. Accordingly, the implementation tool 706 includes a map tool 712, a place-and-route (PAR) tool 714, and a bitstream generator 716. The system 700 may be implemented using the computer for example. Notably, the tools may be part of one or more software programs stored in a memory and configured for execution by a central processing unit (CPU).

One or more aspects of the present disclosure relate to creating dynamically reconfigurable modules for use in an FPGA ("modular design"). For example, the logic design is divided into a top-level design having modules. Each of the modules is either a static logic module or a reconfigurable module. A reconfigurable module is capable of partial dynamic active reconfiguration when the target FPGA is active via a partial reconfiguration process. In one example, the reconfigurable module is expanded through a partial reconfiguration flow that allows for the reconfigurable module to use routing resources that are external to the physical region of the reconfigurable module.

The present disclosure describes a method that utilizes different regions for routing from regions that are used for placement purposes for each reconfigurable module. For example, one region (broadly a first region) is used exclusively for placement of reconfigurable module logic, i.e., units for logic function placement are limited to this first region. In contrast, another region (broadly a second region), which is larger, is used for routing of the reconfigurable module logic. In one example, the second region encompasses the first region as discussed below. The method of the present disclosure allows reconfigurable module logic to use routing resources in programmable units originally reserved exclusively for static logic.

FIG. 8 is again an illustrative block diagram depicting an illustrative example of an FPGA device 800 that is used to illustrate a routing problem. More specifically, routing congestions tend to manifest along the boundaries 820 and especially at the corners of a reconfigurable module region 810, due to the reduction of adjacent routing resources. Although only one boundary 820 is identified in FIG. 8, it should be noted that the reconfigurable module region 810 has many boundaries and corners which are not identified with a reference numeral to improve clarify of the drawing. This may result in a design failing to route certain nets and/or failing to meet timing requirements. Similarly, gap(s) 830 in physical regions of a given reconfigurable module may also pose challenges in routing since reconfigurable module logic are restricted to use routing resources only in the specified but "disjointed" regions of the reconfigurable module. It should be noted that the term "disjointed" does not mean that the physical regions of a given reconfigurable module are not connected or contiguous, but instead indicates that the gap(s) 830 will cause a much longer routing path to be used than if the gap(s) 830 did not exist. Again, undesired results may result, e.g., nets do not route efficiently, clock skew, and/or nets do not meet timing requirements.

The present method provides an opportunity to solve the above-mentioned routing problems. For example, the present method provides improvements in design routability and quality of result (QoR) for FPGA devices. For a modular design, the illustrative logic design system 700 is used to separately implement the modules and then the top-level design, as described more fully below. For purposes of clarity by example, the logic design system 700 is described below with respect to a logic design in general. Features of the design system 700 specifically pertaining to modular design are described along with FIG. 9.

In particular, the logic capture tool 702 is configured to capture or receive a circuit design from a user, e.g., via a user interface and generate a behavioral description 718 of the circuit design. The behavioral description 718 may include a plurality of circuit components, such as flip-flops, memories, LUTs, and the like, connected together via signal conductors (nets). The logic capture tool 702 may include a graphic interface through which a designer connects symbols and blocks representing various components to produce a schematic description of the circuit design. The logic capture tool 702 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 704 is configured to receive the behavioral description 718. The synthesis tool 704 processes the behavioral description 718 to produce a logical description 720 of the circuit design. The logical description 720 includes a logical network list ("netlist") of lower-level circuit elements and logic gates, as well as connections (nets) between inputs and outputs thereof, in terms of the hierarchy specified in the behavioral description 718. For example, the logical description 720 may be compliant with the Electronic Design Interchange Format (ED IF). The synthesis tool 704 may also generate constraint data associated with the logical description 720 that includes various timing and layout constraints. Alternatively, the logical description 720 may be annotated with constraint data. Such an annotated netlist is produced by XST synthesis tool, commercially available from Xilinx, Inc., of San Jose, Calif.

The floorplanner 708 is configured to receive the logical description 720. The floorplanner 708 may comprise a graphical tool that gives a designer control over location of circuit components of a logic design in the target FPGA. In one example, the floorplanner 708 displays a hierarchical representation of the logic design in a window of a graphic interface using hierarchy structure lines and colors to distinguish the different hierarchical levels. The window displays the floorplan of the target FPGA and allows the designer to draw rectangles into which the designer places logic from the hierarchy. The floorplanner 708 generates various constraints that are provided as part of constraint data 724. Such constraints include positions and ranges of logic blocks. A designer may use the constraint editor 710 to add various constraints to the constraint data 724, such as PERIOD constraints (i.e., the time between rising edges of a clock signal) for all clocks, as well as input/output (IO) timing constraints (time between two pins, typically measured from a clock input at a first pin and data out at a second pin) for 10 s.

The map tool 712 is configured to receive the logical description 720 and the constraint data 724. The map tool 712 maps the logical description 720 onto physical resources within the target FPGA (i.e., the circuit components, logic gates, and signals are mapped onto LUTs, flip-flops, clock buffers, I/O pads, and the like of the target FPGA). The map tool 712 produces a mapped circuit description 726 in accordance with any constraints in the constraint data 724. The mapped circuit description 726 includes groupings of the physical resources of the target FPGA expressed in terms of CLBs and IOBs that include these resources. The mapped circuit description 726 does not include physical location information.

The PAR tool 714 is configured to receive the mapped circuit description 726 and the constraint data 724. The PAR tool 714 determines placement for the physical resource groupings of the mapped circuit description 726 in the target FPGA and apportions the appropriate routing resources. The PAR tool 714 performs such placement and routing in accordance with any constraints in the constraint data 724. The PAR tool 714 produces physical design data 728. The bitstream generator 316 is configured to receive the physical design data 728 and produce bitstream data 730 for the target FPGA.

Figure 9:
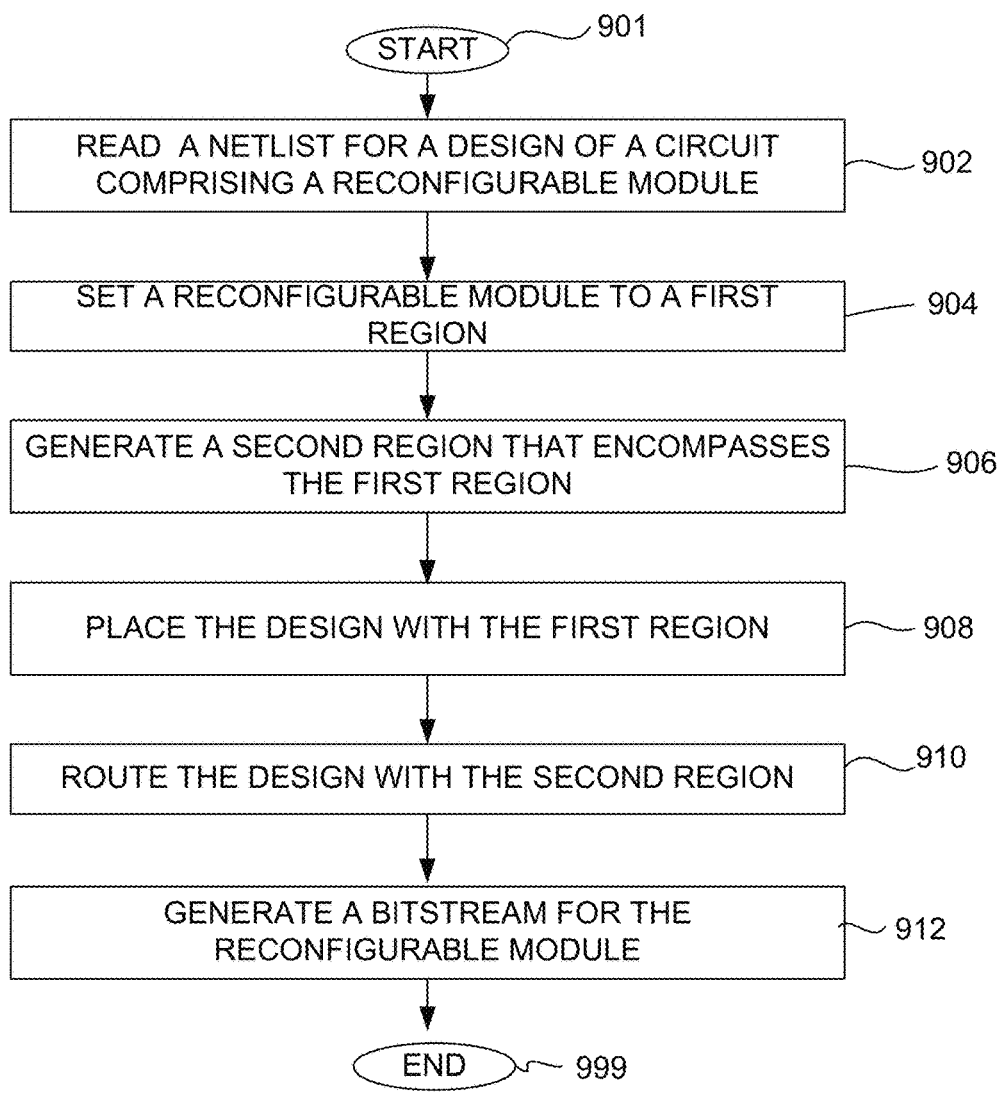
FIG. 9 depict a flow diagram of an illustrative example of a method for providing a partial reconfiguration of a reconfigurable module in accordance with one or more aspects of the present disclosure.
Figure 10:
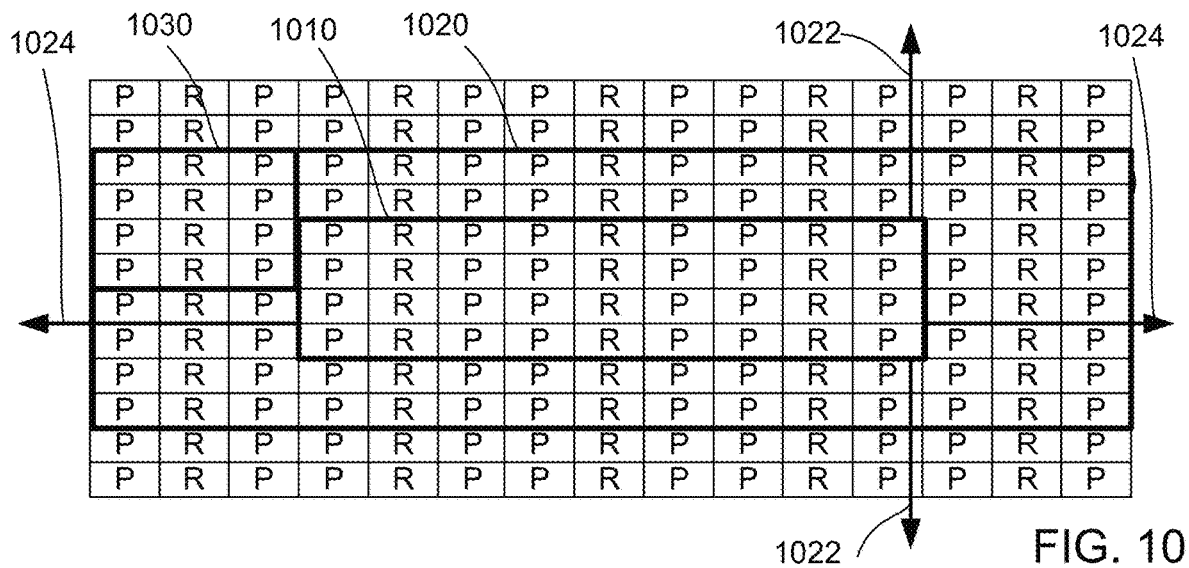
FIG. 10 is an illustrative block diagram depicting another illustrative example of an FPGA partial reconfiguration architecture.

FIG. 9 illustrates a flow diagram of an illustrative example of a method 900 for providing a partial reconfiguration (or broadly a configuration) of a reconfigurable module in accordance with one or more aspects of the present disclosure. In one example, steps, functions and/or operations of the method 900 may be performed by a logic design system 700 as discussed above. In another example, the steps, functions, or operations of method 900 may be performed by a computing device or system, and/or processor. For instance, computing device or system may represent a logic design system 700 of the present disclosure. For illustrative purposes, the method 900 is described in greater detail below in connection with an example performed by a processor. FIG. 10 depicts an illustrative example of an FPGA partial reconfiguration architecture with an expanded region. The reader is encouraged to refer to FIG. 10 in conjunction with FIG. 9 to follow the description of method 900.

The method 900 begins at step 901. At step 902, the processor reads a netlist for a design of a circuit comprising a reconfigurable module, e.g., a design for an FPGA. For example, the netlist is read by map tool 712 of FIG. 7 and the netlist is for a design of a circuit comprising one or more reconfigurable modules.

At step 904, the processor sets or specifies a reconfigurable module region (e.g., 1010 of FIG. 10) to a physical region of the circuit. For example, the processor accepts and executes a placement command or instruction. The specified first region is the area in which the units for logic function for the reconfigurable module will be placed.

At step 906, the processor generates or specifies a second region that encompasses the first region. Said another way, the processor expands the first region in one or more directions of the circuit to generate the second region. As a result, the second region is larger than the first region.

At step 908, the processor places the design with the first region, e.g., placing the logic functions associated with the reconfigurable module within the first region. The region outside of the first region may receive placement of the static logic and/or the logic functions of another reconfigurable module.

Figure 8:
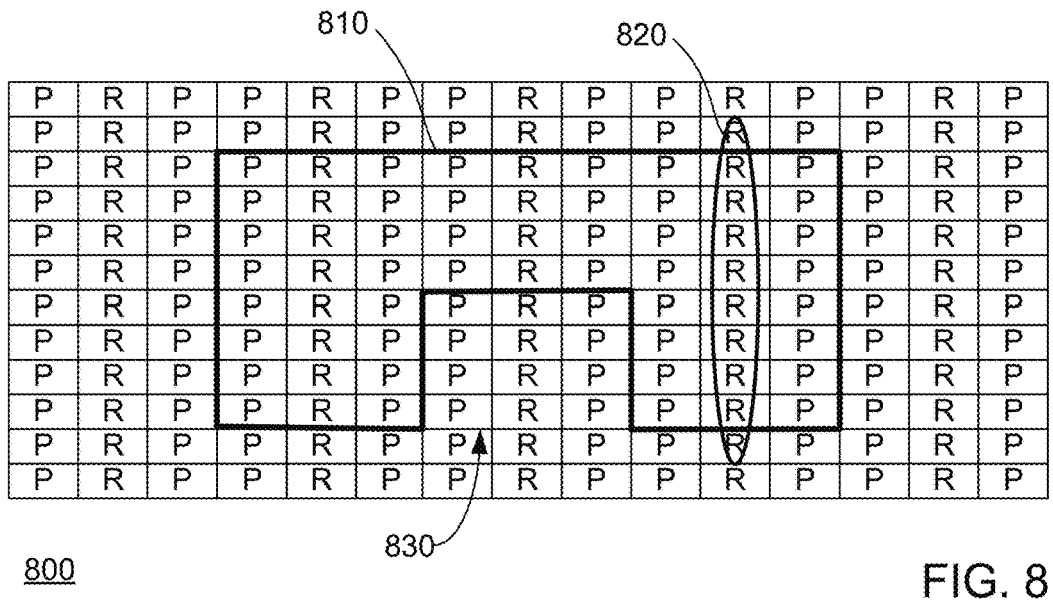
FIG. 8 is an illustrative block diagram depicting an illustrative example of an FPGA partial reconfiguration architecture.

At step 910, the processor routes the design with the second region, e.g., routing the logic functions associated with the reconfigurable module within the second region (e.g., 1020 of FIG. 10). In other words, the routing resources of the region outside of the first region may now be used to route the logic functions associated with the reconfigurable module. Said another way, the routing resources of a static logic (e.g., shown as 1030 in FIG. 10) that is external to the first region can now be used by the reconfigurable module thereby alleviating the problems as illustrated by FIG. 8 above. In sum, the region specified for reconfigurable module has been expanded with respect to available routing resources that can be used to route the logic functions associated with the reconfigurable module. More specifically, pertaining to steps 912 and 914 the logic design for each static module and reconfigurable module can be placed and routed using the PAR tool 714 of FIG. 7 in accordance with the constraint data of the top-level design and any constraint data for the module design. For example, the PAR tool 714 may route some signals for a reconfigurable module into a static logic implementation area. That is, routing resources in a static logic implementation area are used to route signals for the reconfigurable module.

At step 912, the processor generates a bitstream (broadly a partial bitstream relative to a full bitstream for the entire design of the circuit) for the reconfigurable module. Alternatively, the processor may generate the full bitstream for the entire design of the circuit at this stage.

Although not shown in FIG. 9, if the determination is made that there are more reconfigurable modules to be reconfigured, then various steps of FIG. 9 are repeated until the full design for the full circuit has been configured. In other words, method 900 is described with respect to a single reconfigurable module for clarity reasons. Furthermore, during the final assembly phase (not shown in FIG. 9), physical implementations of the various static logic and reconfigurable modules are combined to produce a complete physical design. In other words, at least one full design implementation file is generated by combining the static logic modules with various reconfigurable modules. The implementations for the modules in the active implementation phase are preserved, where the resultant bitstream(s) are full device programming files. However, one or more partial design implementations may also be produced. The partial design implementations are produced by mapping, placing, routing, and generating a partial bitstream for the top-level design and the various reconfigurable modules using the map tool 712, the PAR tool 714, and the bitstream generator 716 of FIG. 7. The resultant bitstream(s) are partial device programming files and are used to reconfigure or dynamically change the functional behavior of a given reconfigurable module. This reconfiguration of a given reconfigurable module can take place while the rest of the device, as defined in the static logic modules and the reconfigurable modules not being updated, continue to operate in a glitchless manner. By "glitchless" it is meant that executing logic in the static logic modules and the reconfigurable modules not being updated will be unaffected by the programming of values into memory cells during dynamic reconfiguration. The method 900 ends at step 999.

It should be noted that there are many different ways to select the size of the second region. Said another way, there are many different ways to expand the size of the first region in one or more directions on the circuit to arrive at the second region. In one example, the processor in step 906 will fill a horizontal gap, a vertical gap and/or both horizontal and vertical gaps as shown by 830 of FIG. 8. Alternatively, the processor in step 906 may expand the size of the first region in one or more vertical 1022 (e.g., up and/or down) and/or horizontal 1024 (e.g., left and/or right) directions. More specifically, the processor in step 906 may expand the size of the first region in one or more vertical 1022 directions until a region overlap is encountered, e.g., encountering the border of another reconfigurable module. Similarly, the processor in step 906 may expand the size of the first region in one or more horizontal 1024 directions until a region overlap is encountered, e.g., encountering the border of another reconfigurable module. Alternatively, the processor in step 906 may also expand the size of the first region in one or more vertical 1022 and horizontal 1024 directions to a unit of higher order (e.g., a clock region). Alternatively, in one example the processor in step 906 may also expand the size of the first region by receiving manual inputs that define the expanded first region, e.g., a specific size predefined by the user. It should be noted that any number of the above "expansion" methods can be used individually or in combination in step 906 of FIG. 9 discussed above.

Figure 11:
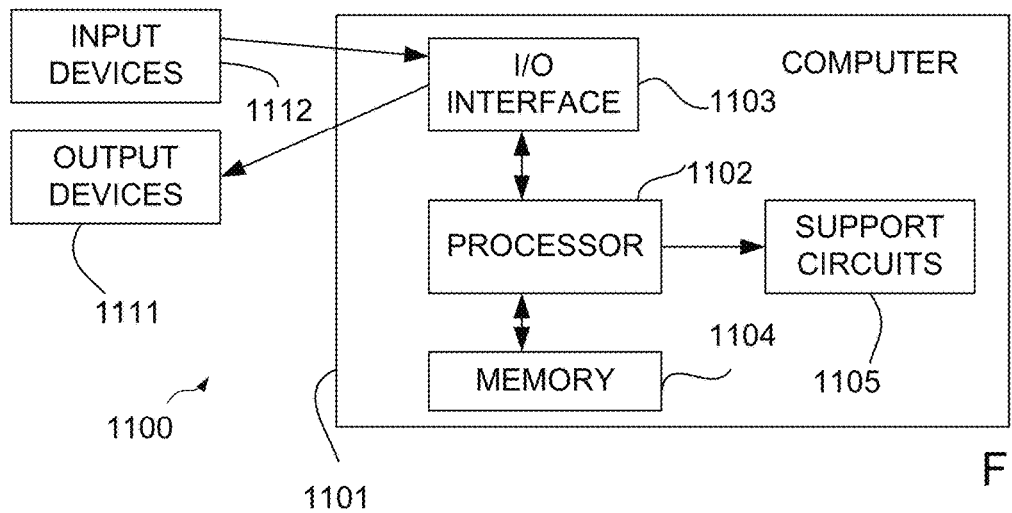
FIG. 11 is a block diagram depicting an illustrative example of a computer suitable for implementing the processes and methods described herein

FIG. 11 is a block diagram depicting an illustrative example of a system 1100 having a computer 1101 suitable for implementing the processes and methods described herein. For example, the computer 1101 may be used to implement the system 700 of FIG. 7, as well as the method 900 of FIG. 9. The computer 1101 includes a processor 1102, a memory 1104, various support circuits 1105, and an I/O interface 1103. The processor 1102 may be any type of microprocessor known in the art. The support circuits 1105 for the processor 1102 include conventional cache, power supplies, clock circuits, data registers, I/O interfaces, and the like. The I/O interface 1103 may be directly coupled to the memory 1104 or coupled through the processor 1102. The I/O interface 1103 may be coupled to various input devices 1112 and output devices 1111, such as a conventional keyboard, mouse, printer, display, and the like.

The memory 1104 stores all or portions of one or more programs and/or data to implement the system 700 and the method 900 described herein. Although one or more aspects of the present disclosure are disclosed as being implemented as a computer executing a software program, those skilled in the art will appreciate that the present disclosure may be implemented in hardware, software, or a combination of hardware and software. Such implementations may include a number of processors independently executing various programs and dedicated hardware, such as ASICs.

The computer 1101 may be programmed with an operating system, which may be OS/2, Java Virtual Machine, Linux, Solaris, Unix, Windows, Windows95, Windows98, Windows NT, and Windows2000, WindowsME, WindowsXP, Windows 7, Windows 8, and Windows 10 among other known platforms. At least a portion of an operating system may be disposed in the memory 1104. The memory 1104 may include one or more of the following random access memory, read only memory, magneto-resistive read/write memory, optical read/write memory, cache memory, magnetic read/write memory, and the like, as well as signal-bearing media as described below.

It should be noted that the present disclosure can be implemented in software and/or in a combination of software and hardware, e.g., using application specific integrated circuits (ASIC), a programmable gate array (PGA) including a Field PGA, or a state machine deployed on a hardware device, a computing device or any other hardware equivalents, e.g., computer readable instructions pertaining to the method discussed above can be used to configure a hardware processor to perform the steps, functions and/or operations of the above disclosed method 900. In one embodiment, instructions and data for the present method or process 900 (e.g., a software program comprising computer-executable instructions) can be loaded into memory 1104 and executed by the processor 1102, e.g., a hardware processor, to implement the steps, functions or operations as discussed above in connection with the illustrative method 900. Furthermore, when a hardware processor executes instructions to perform "operations," this could include the hardware processor performing the operations directly and/or facilitating, directing, or cooperating with another hardware device or component (e.g., a co-processor and the like) to perform the operations.

An aspect of the present disclosure is implemented as a program product for use with a computer system. Program(s) of the program product defines functions of examples and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter example specifically includes information downloaded from the Internet and other networks. Such signal-bearing media, when carrying computer-readable instructions that direct functions of the present disclosure, represent examples of the present disclosure.

The processor executing the computer readable or software instructions relating to the above described method can be perceived as a programmed processor or a specialized processor. As such, the present method 500 (including associated data structures) of the present disclosure can be stored on a tangible or physical (broadly "non-transitory") computer-readable storage device or medium, e.g., volatile memory, non-volatile memory, ROM memory, RAM memory, magnetic or optical drive, device or diskette and the like. Furthermore, a "tangible" computer-readable storage device or medium comprises a physical device, a hardware device, or a device that is discernible by the touch. More specifically, the computer-readable storage device may comprise any physical devices that provide the ability to store information such as data and/or instructions to be accessed by a processor or a computing device such as a computer or an application server.

Figure 12:
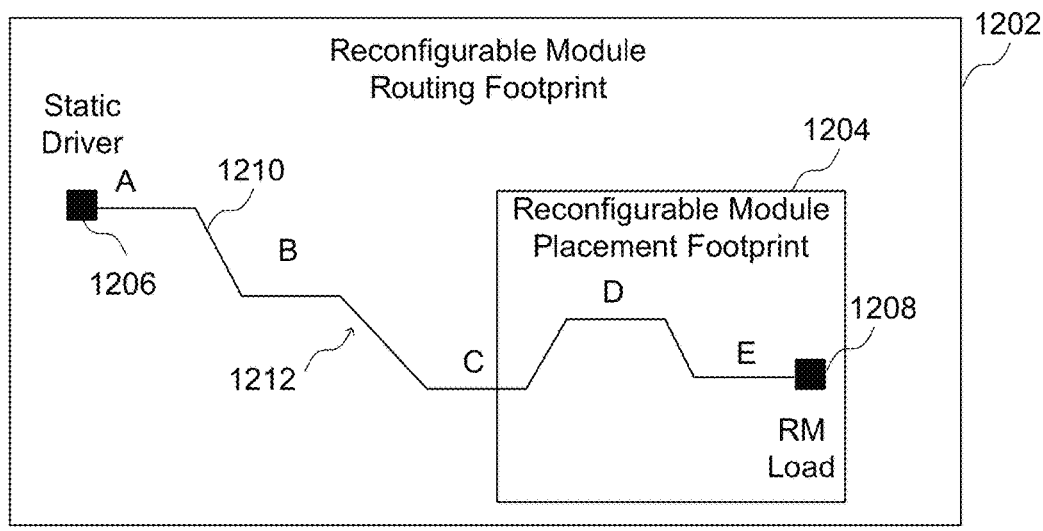
FIG. 12 is a block diagram of a reconfigurable module placement footprint having an initial placement.
Figure 13:
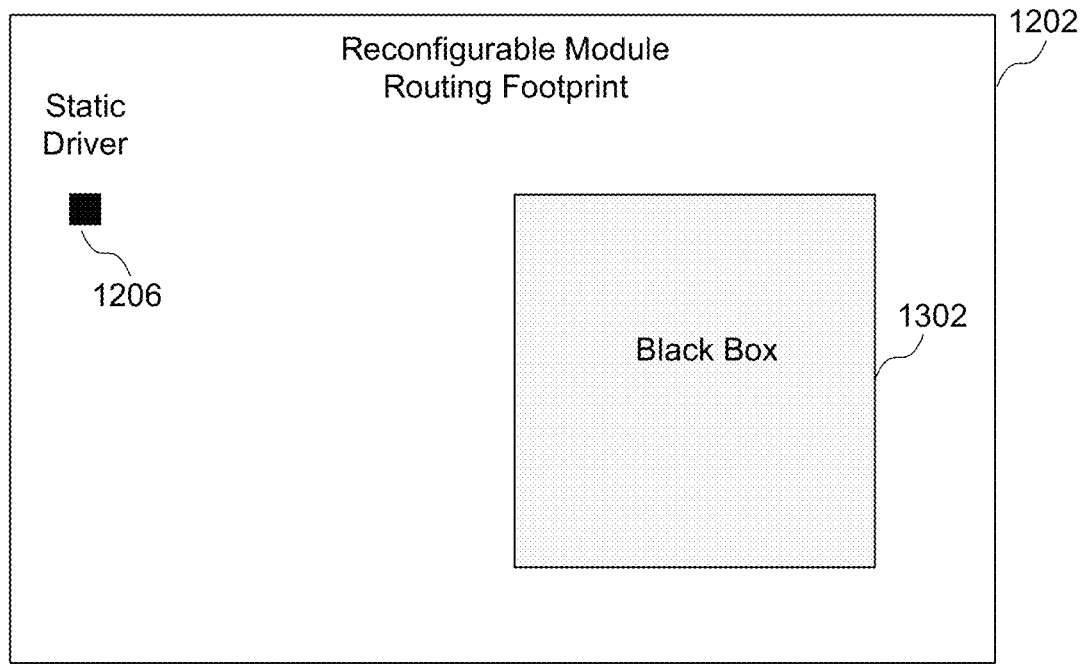
FIG. 13 is a block diagram of a reconfigurable module placement footprint associated with a partial reconfiguration.
Figure 14:
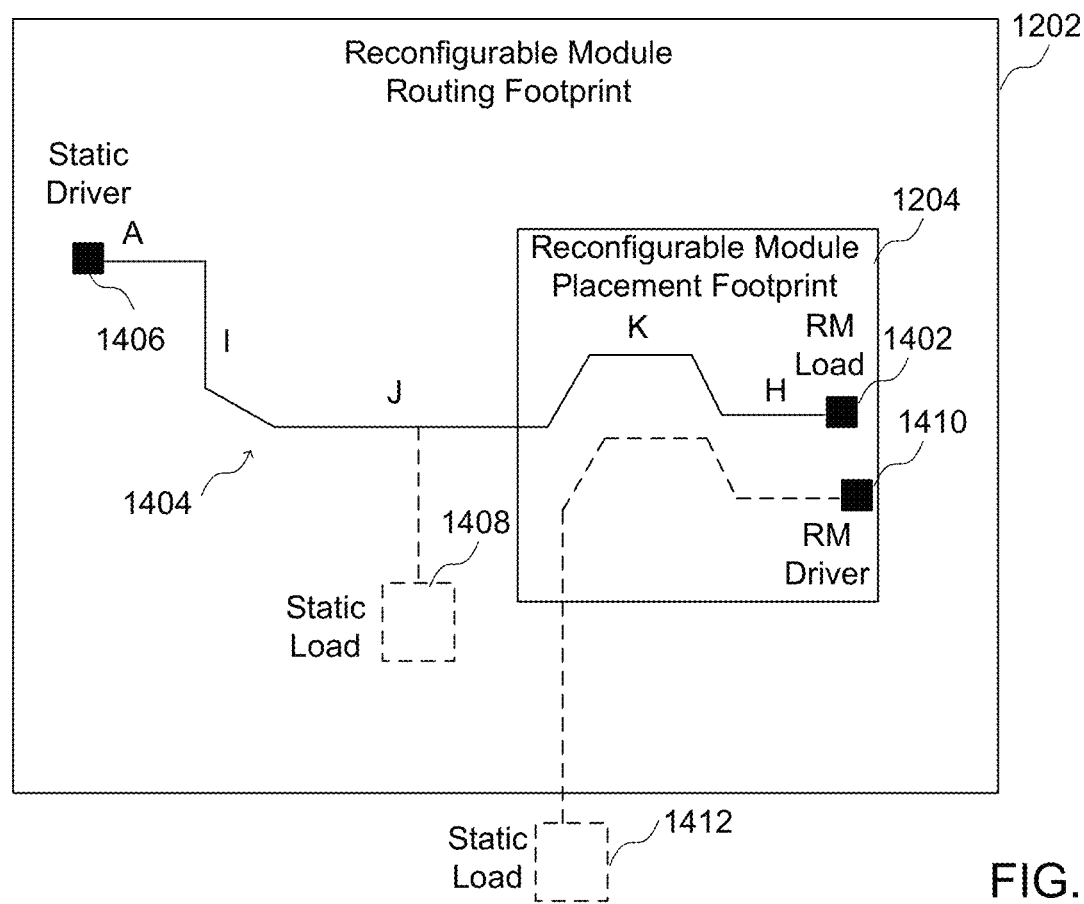
FIG. 14 is a block diagram of a reconfigurable module placement footprint having a new RM load after a partial reconfiguration.

Turning now to FIGS. 12-14, a method of implementing a partial reconfiguration in an integrated circuit is described. Any given reconfigurable module has a placement footprint and a routing footprint, where the driver may be placed inside reconfigurable module placement footprint (i.e. a RM driver), and the load may be placed outside the reconfigurable module placement footprint (i.e. a Static load). For a boundary connection between Static load and RM driver, there may be a sequence of 4 routing nodes A, B, C and D, where a routing node B may be the partition pin node. That is, the routing node D is the RM routing while routing nodes A, B, and C are part of the Static routing. According to one implementation of a method of implementing a partial reconfiguration in an integrated circuit device, a goal may be to remove the partition pin assignment on boundary paths.

More particularly, a route-carve-reroute process could be organized in a plurality of steps. According to a first step, an initial implementation without partition pin assigned on boundary net with a static driver and RM load could be performed. The partition pin assignment is skipped either at the beginning of router or at the end of router. With partition pin removal, the routing honors routing containment constraints (i.e. all routing nodes need to be fully contained inside Reconfigurable Module routing footprint). According to a second step of carving out the RM logic, all previous routing nodes are removed. According to a third step of re-implementation of new RM logic, the router reroutes the whole net (starting from site-pin node A) which has the best routability to new RM logic.

According to some implementations, the partition pin assignment is skipped by router during initial implementation. For the carving process, instead of preserving the routing nodes between partition pin nodes and Static site-pin nodes, all the routing nodes are removed. Later in the re-implementation process, the router will reroute the boundary net starting from Static site-pin.

More particularly, as shown in FIG. 12, a block diagram of a reconfigurable module placement footprint having an initial placement is shown. A first region is a reconfigurable module routing footprint 1202 having a second region within the first region comprising a reconfigurable module placement footprint 1204. A RM load 1208 is placed within the reconfigurable module placement footprint 1204 as shown. Interconnect elements 1210 extend between nodes, designated at nodes A, B, C, D, and E in FIG. 12, to create a routing path 1212 which is an electrical path between the static driver 1206 and the RM load 1208. The interconnect elements could be metal traces connected by programmable switches of an integrated circuit device, such as PIPs for example. The interconnect elements of a programmable logic device are determined during a routing process for example.

During a reconfiguration process, the routing path 1212 is eliminated as shown in FIG. 13, and the region defining the reconfigurable module placement footprint is treated as a black block 1302. That is, the placement of the RM load and the routing of a routing path from a static driver outside of the reconfigurable module placement footprint to an RM load inside the reconfigurable module placement footprint is performed without regard to a location of a partition pin. As shown in FIG. 14, a reconfigurable module placement footprint associated with a partial reconfiguration includes a new RM load 1402 at a node H coupled by a new routing path 1404 at a node A, including nodes A, I, J, K and H.

It should be noted that a partition pin for a reconfigurable module may be retained during a partial reconfiguration in certain circumstances. For example, the partition pin may be retained when the static driver 1406 also drives a load outside of the reconfigurable module placement footprint 1204, such as a static load 1408 that is within the reconfigurable module routing footprint 1204. The partition pin may also be retained when an RM driver drives a static load outside of the reconfigurable module routing footprint 1202, such as when a static driver 1410 drives the static load 1412 outside of the reconfigurable module routing footprint 1202. The partition pin may also be retained when a driver of a load of the reconfigurable module placement footprint 1204 is outside of the reconfigurable module routing footprint 1202.

Figure 15:
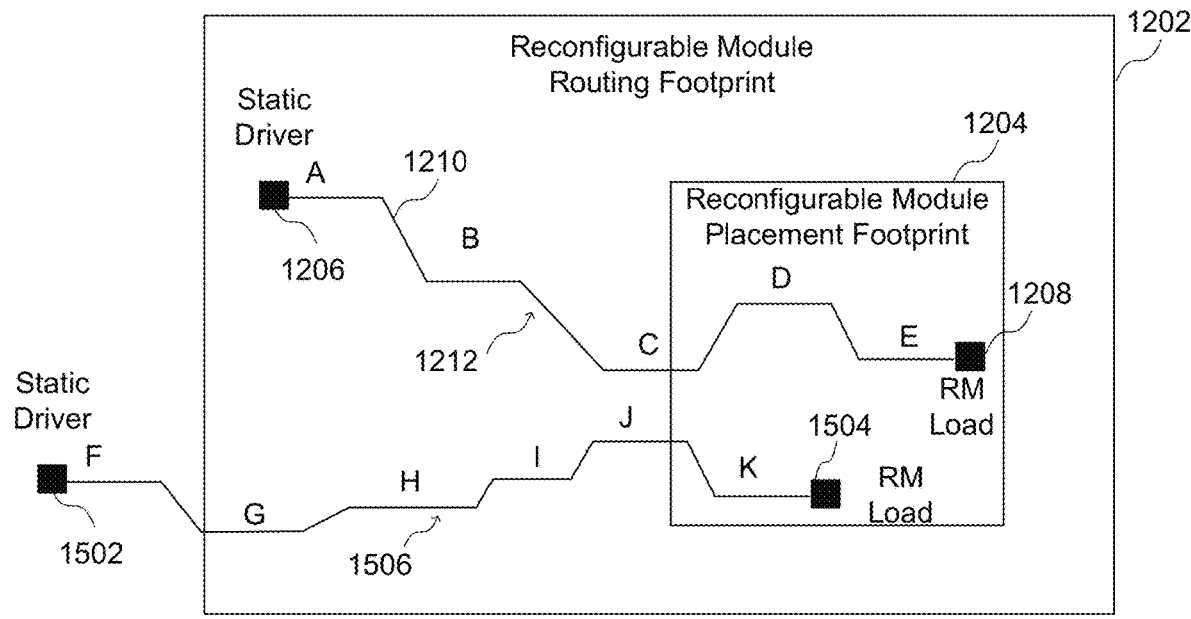
FIG. 15 is a block diagram of a reconfigurable module placement footprint having a first static driver within a reconfigurable module routing footprint and a second driver outside of the reconfigurable module routing footprint.

Turning now to FIG. 15, a block diagram of a reconfigurable module placement footprint having a first static driver within a reconfigurable module routing footprint and a second driver outside of the reconfigurable module routing footprint is shown. More particularly, a first static driver 1206 at node A is coupled to an RM load 1208 at node E as shown in FIG. 12. A second static driver 1502 is also coupled by a routing path 1506 of interconnect elements at various nodes to a second RM load 1504 in the reconfigurable module placement footprint 1204. However, because the second static driver 1502 is outside of the reconfigurable module routing footprint, the partition pin J will be retained in any partial reconfiguration that would lead to the re-routing from the static driver 1502 to the RM load 1504. According to one implementation, due to partial reconfiguration routing containment requirements, it may be possible to only remove a partition pin assignment for boundary nets with Static drivers/loads placed inside reconfigurable module routing footprint range. Otherwise, the partition pin assignment would be retained. As shown in FIG. 15, there is no partition pin assignment for the routing path 1212, while the partition pin (node J) is assigned.

Figure 16:
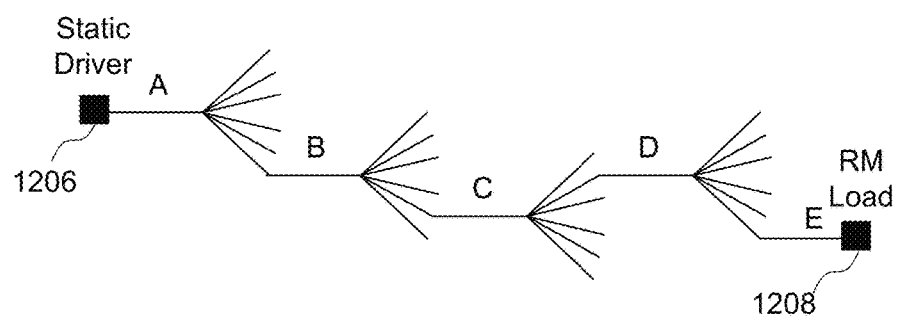
FIG. 16 is a block diagram of a path between a static driver and an RM load.

FIG. 16 shows why a Static site-pin has the best routability than all its uphill/downhill nodes. FIG. 16 shows the routing path from Static driver to RM load. The routing paths has 5 routing nodes, A, B, C, D and E. A is the Static driver site-pin (source), while E is the RM load site-pin (destination). For each routing node, it is assumed to have 6 downhill options. Based on the analysis data in Table I, from source node A to destination node E, there are the most number of possible available paths: 1,296. Therefore, the best routability would be expected if the path is re-routed from Static site-pin for the path above. Similar analysis could be applied on the routing path is in the opposite direction between a RM driver and a static load.

TABLE 1

| Nodes | Destination A | Destination B | Destination C | Destination D | Destination E |
| --- | --- | --- | --- | --- | --- |
| Source A | — | 6 | 36 | 216 | 1,296 |
| Source B | — | — | 6 | 36 | 216 |
| Source C | — | — | — | 6 | 36 |
| Source D | — | — | — | — | 6 |
| Source E | — | — | — | — | — |

By removing partition pin assignment, more flexibility is provided for therouter in an initial configuration for boundary nets which are not proper for post-route partition pin selection. This extra flexibility brings QoR and routability improvement in an initial configuration. Also, since the rerouting is from a static site-pin, it improves the QoR/and routability in re-implementation process in a partial reconfiguration flow. In testing programmable logic devices from Xilinx, Inc. of San Jose, Calif., the changing of the location of the partition pin brought about 1% QoR gain in HD_US_QOR suite for example. The HD_US_QOR suite has 50 complex designs under Partial Reconfiguration flow. These designs have realistic timing and are used for general Partial Reconfiguration flow QoR/Routability tuning. Furthermore, 6 out of 9 designs that originally had a routing failure were successfully routed in HD__US_QOR_2_IG suite by removing the partition pin of the reconfigurable module assigned by the placer. HD_US_QOR_2_CONFIG has 45 designs, some of which are from HD_US_QOR, where the difference is that HD_US_QOR_2_CONFIG runs both initial configuration and re-implementation using the same reconfigurable module net-list. This feature of removing the partition pin was suitable for designs with a reconfigurable module routing footprint as the entire device, e. g. SDACCEL designs, and Field-Update designs. SDACCEL designs are for an SDACCEL product. These designs are all under Partial Reconfiguration flow re-implementation, those designs have an expanded routing footprint that covers the entire device and there is no partition-pin left after the proposed partition-pin reduction. As tested on field-update design suite DBLO_PCIE_FU, the removal of the partition pin picked-up 32 out of 40 designs with both routing issues and timing closure issues. The DBLE_PCIE_FU suites has 147 designs combining both Partial Configuration (Tandem flow) and Partial Reconfiguration flow with both a fast PCIE boot and a partial reconfigurable feature. It is suitable for partition-pin reduction as set forth above because the expanded routing footprint covers the entire device. So after partition-pin reduction, there is no partition pin in the flow.

Figure 17:
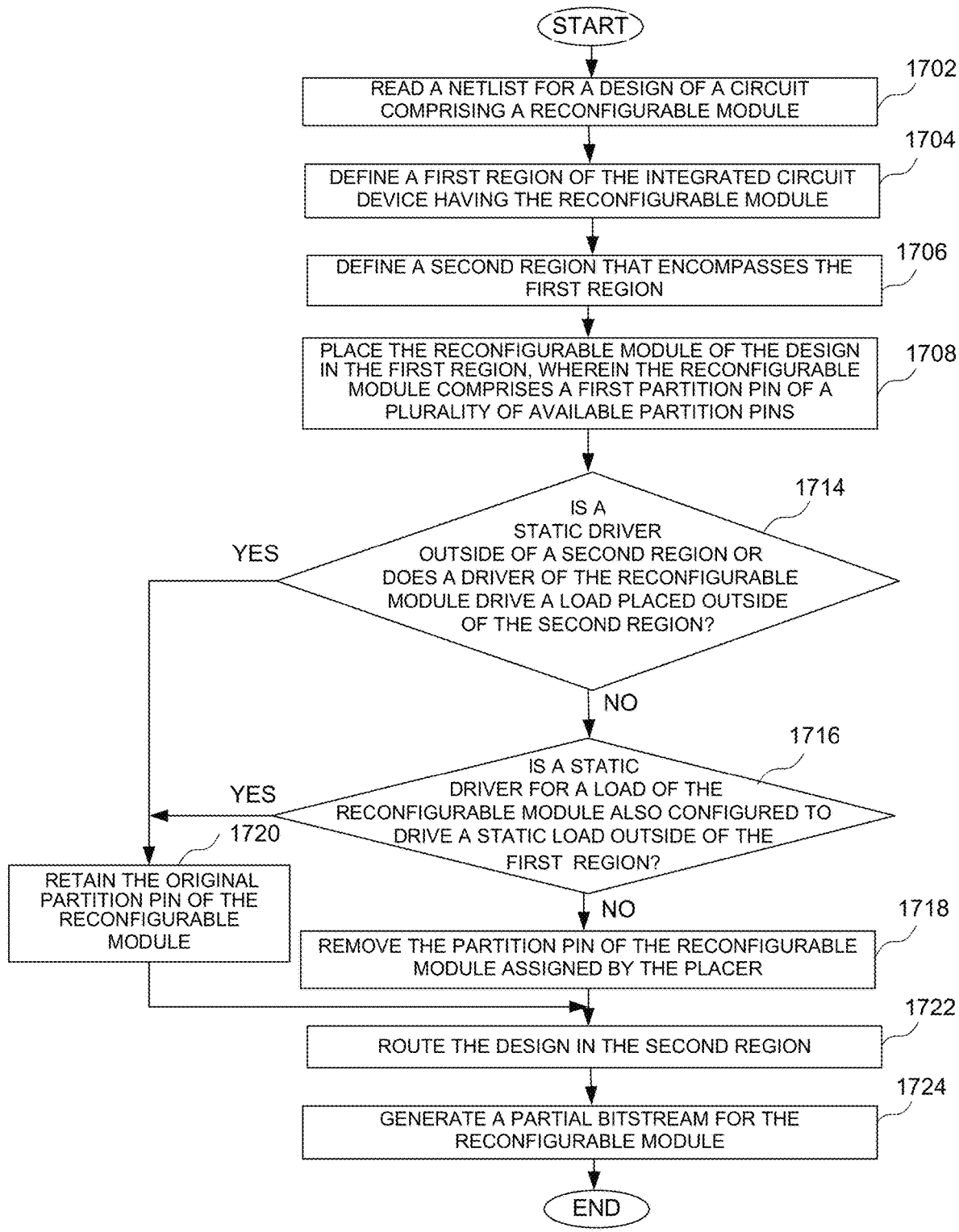
FIG. 17 is a flow diagram showing a method of implementing a partial reconfiguration in an integrated circuit device.

Turning now to FIG. 17, a flow diagram shows a method of implementing a partial reconfiguration in an integrated circuit device. A netlist for a design of a circuit comprising a reconfigurable module is read at a block 1702. A first region of the integrated circuit device having the reconfigurable module is defined at a block 1704. The first region could be a reconfigurable module placement footprint, such as reconfigurable module placement footprint 1204 as described above in reference to FIG. 11 for example.

A second region that encompasses the first region is defines at a block 1706. The second module cold be a reconfigurable module routing footprint, such as reconfigurable module routing footprint 1202 described above in reference to FIG. 11 for example.

The reconfigurable module of the design is placed in the first region at a block 1708, wherein the reconfigurable module comprises a first partition pin of a plurality of available partition pins.

The partition pin may be retained is certain circumstances. More particularly, it is determined whether a static driver for a load of the reconfigurable module is outside of the second region or whether an RM driver for a load of the reconfigurable module also drives a load placed outside the second region at a block 1714. It is then determined whether a static driver for a load of the reconfigurable module is also configured to drive a static load outside of the first region at a block 1716. If neither a static driver is outside the second region or an RM driver for a load of the reconfigurable module drives a load placed outside the second region in block 1714, nor the static driver for a load of the reconfigurable module also drivers a static load outside the first region in block 1716, the partition pin of the reconfigurable module is removed during a routing process at a block 1718. Otherwise, the partition pin of the reconfigurable module placed during a placement process is retained at a block 1720.

The loads and drivers in second region of the design are routed at a block 1722. That is, the nets of the design with drivers and all loads fully contained in the second region are routed. A partial bitstream for the reconfigurable module is then generated at a block 1724.

The various elements of the method of FIG. 17 may be implemented using the circuits of FIGS. 1-16 as described, or using some other suitable circuits. While specific elements of the method are described, it should be understood that additional elements of the method, or additional details related to the elements, could be implemented according to the disclosure of FIGS. 1-16.

It can therefore be appreciated that new circuits for and methods of implementing a partial reconfiguration in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A method of implementing a partial reconfiguration in an integrated circuit device, the method comprising:
reading a netlist for a design of a circuit comprising a reconfigurable module;
defining a first region of the integrated circuit device having the reconfigurable module;
defining a second region that encompasses the first region;
placing the reconfigurable module of the design in the first region, wherein the reconfigurable module comprises a partition pin of a plurality of available partition pins associated with an initial placement;
selectively removing the partition pin associated with the initial placement;
replacing the reconfigurable module;
routing drivers and loads that are in the second region after removing the partition pin associated with the initial placement; and
generating a partial bitstream for the reconfigurable module, wherein the partial bitstream for the reconfigurable module comprises a new partition pin for the first region.

2. The method of claim 1, wherein the placing comprises placing logic functions associated with the reconfigurable module within the first region.

3. The method of claim 1, wherein the routing comprises routing logic functions associated with the reconfigurable module within the second region.

4. The method of claim 3, wherein the routing uses routing resources of static logic that is external to the first region.

5. The method of claim 1, wherein the defining the second region comprises expanding the first region in at least one of a horizontal direction and a vertical direction.

6. The method of claim 5, wherein the defining the second region comprises expanding the first region in the at least one of the horizontal direction and the vertical direction until another reconfigurable module is encountered.

7. The method of claim 6, wherein placing the reconfigurable module comprises placing a partition pin of the reconfigurable module during a placement process.

8. The method of claim 1, wherein selectively removing the partition pin comprises retaining the partition pin of the reconfigurable module when a static driver for a load of the reconfigurable module is also configured to drive a static load outside of the first region.

9. The method of claim 1, wherein selectively removing the partition pin comprises retaining the partition pin of the reconfigurable module when a static driver for a load of the reconfigurable module is outside of the second region.

10. The method of claim 1, wherein selectively removing the partition pin comprises retaining the partition pin of the reconfigurable module when a driver of the reconfigurable module drives a load outside of the second region.

11. The method of claim 1, wherein the reconfigurable module comprises programmable logic of a programmable logic device (PLD).

12. A system comprising:
a processor; and
a computer-readable medium storing instructions which, when executed by the processor, cause the processor to perform operations, the operations comprising:
reading a netlist for a design of a circuit comprising a reconfigurable module;
defining a first region of the integrated circuit device having the reconfigurable module;
defining a second region that encompasses the first region;
placing the reconfigurable module of the design in the first region, wherein the reconfigurable module comprises a partition pin of a plurality of available partition pins associated with an initial placement;
selectively removing the partition pin associated with the initial placement;
replacing the reconfigurable module;
routing drivers and loads that are in the second region after removing the partition pin associated with the initial placement; and
generating a partial bitstream for the reconfigurable module, wherein the partial bitstream for the reconfigurable module comprises a new partition pin for the first region.

13. The system of claim 12, wherein the operation of placing the reconfigurable module comprises placing a partition pin of the reconfigurable module during a placement process.

14. The system of claim 12, wherein the operation of selectively removing the partition pin comprises retaining the partition pin of the reconfigurable module when a static driver for a load of the reconfigurable module is also configured to drive a static load outside of the first region.

15. The system of claim 12, wherein the operation of selectively removing the partition pin comprises retaining the partition pin of the reconfigurable module when a static driver for a load of the reconfigurable module is outside of the second region.

16. The system of claim 12, wherein the operation of selectively removing the partition pin comprises retaining the partition pin of the reconfigurable module when a driver of the reconfigurable module drives a load outside of the second region.

17. A non-transitory computer-readable medium storing instructions which, when executed by a processor, cause the processor to perform operations, the operations comprising:
reading a netlist for a design of a circuit comprising a reconfigurable module;
defining a first region of the integrated circuit device having the reconfigurable module;
defining a second region that encompasses the first region;
placing the reconfigurable module of the design in the first region, wherein the reconfigurable module comprises a partition pin of a plurality of available partition pins associated with an initial placement;
selectively removing the partition pin associated with the initial placement;
replacing the reconfigurable module;
routing drivers and loads that are in the second region after removing the partition pin associated with the initial placement; and
generating a partial bitstream for the reconfigurable module, wherein the partial bitstream for the reconfigurable module comprises a new partition pin for the first region.

18. The non-transitory computer-readable medium of claim 17, wherein the operation of selectively removing the partition pin comprises retaining the partition pin of the reconfigurable module when a static driver for a load of the reconfigurable module is also configured to drive a static load outside of the first region.

19. The non-transitory computer-readable medium of claim 17, wherein the operation of selectively removing the partition pin comprises retaining the partition pin of the reconfigurable module when a static driver for a load of the reconfigurable module is outside of the second region.

20. The non-transitory computer-readable medium of claim 17, wherein the operation of selectively removing the partition pin comprises retaining the partition pin of the reconfigurable module when a driver of the reconfigurable module drives a load outside of the second region.

* * * * *